(12) United States Patent
Chang

(10) Patent No.: US 9,419,593 B2
(45) Date of Patent: Aug. 16, 2016

(54) CURRENT MODE LOGIC CIRCUIT FOR HIGH SPEED INPUT/OUTPUT APPLICATIONS

(71) Applicant: Kevin Yi Cheng Chang, Tempe, AZ (US)

(72) Inventor: Kevin Yi Cheng Chang, Tempe, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/507,995

(22) Filed: Oct. 7, 2014

(65) Prior Publication Data

US 2016/0099709 A1 Apr. 7, 2016

(51) Int. Cl.
*H03K 3/356* (2006.01)

(52) U.S. Cl.
CPC .................................. *H03K 3/35613* (2013.01)

(58) Field of Classification Search
CPC .................................................. H03K 3/35613
USPC ........................................................... 326/68
See application file for complete search history.

(56) References Cited

U.S. PATENT DOCUMENTS

| | | | |
|---|---|---|---|
| 3,676,801 A | 7/1972 | Musa | |
| 3,890,580 A | 6/1975 | Kuhn, Jr. et al. | |
| 5,451,902 A | 9/1995 | Huang et al. | |
| 5,760,626 A | 6/1998 | Pelley, III | |
| 6,396,329 B1 * | 5/2002 | Zerbe | G11C 7/02 327/319 |
| 7,154,294 B2 * | 12/2006 | Liu | H03K 5/249 326/115 |
| 7,521,976 B1 * | 4/2009 | Sudjian | H03K 3/012 327/199 |
| 7,560,957 B2 | 7/2009 | Chen et al. | |
| 7,724,057 B2 | 5/2010 | Hairapetian | |
| 7,965,120 B2 * | 6/2011 | Lewison | H03K 5/133 327/261 |
| 2003/0052720 A1 * | 3/2003 | Tung | H03K 3/356139 327/218 |
| 2004/0100307 A1 * | 5/2004 | Wong | H03K 3/356139 326/115 |
| 2005/0110525 A1 * | 5/2005 | Chen | H03K 19/09432 326/115 |
| 2007/0200605 A1 * | 8/2007 | Marsh | H03K 3/356043 327/208 |
| 2008/0136482 A1 * | 6/2008 | Chiu | H03K 3/356139 327/213 |
| 2013/0127507 A1 * | 5/2013 | Zhuang | H03K 3/35625 327/203 |
| 2013/0335129 A1 * | 12/2013 | Kao | H03K 3/356043 327/202 |

* cited by examiner

*Primary Examiner* — Dylan White

(57) ABSTRACT

A CML latch includes an input stage including input nodes to receive a differential input signal and output nodes to provide a differential intermediate output signal, and a negative output node to provide a negative side of the differential intermediate output signal, a negative resistance stage including an input node connected to a first voltage source and output nodes connected to the output nodes of the input stage, and a latch stage including input nodes connected to the output nodes of the input stage and output nodes to provide a differential output signal. The negative resistance stage increases a current gain of the input stage.

20 Claims, 5 Drawing Sheets

US 9,419,593 B2

CURRENT MODE LOGIC CIRCUIT FOR HIGH SPEED INPUT/OUTPUT APPLICATIONS

FIELD OF THE DISCLOSURE

This disclosure generally relates to logic circuits, and more particularly relates to a current mode logic circuit for high speed serial input/output applications.

BACKGROUND

Current-mode logic (CML) is a differential digital logic family that is used for high speed data transmission. A CML device typically employs a differential amplifier input stage to perform a logic operation, and can include a follower stage to level shift the outputs to a voltage level that is compatible with the input voltage level, and to drive the differential outputs. Input voltage levels in a CML device are typically low, and the differential amplifier input stage is typically not operated in full swing between two power supplies, resulting in fast switching of logic states. The differential amplifier input stage is driven by a constant current source (e.g., an emitter- or source-resistance) that provides a negative feedback and results in a high input impedance. Both legs of the differential amplifier input stage typically include large load resistors that provide the differential outputs. In operation, one leg of the differential amplifier input stage is typically in cut-off, while the other leg is typically operated in the active linear region, resulting in substantially all of the current running in the active leg.

The bandwidth of the differential amplifier input stage of a CML device is fundamentally limited by the RC time constant associated with the load resistors in combination with the input capacitance of the follower stage or of the next logic device. As such, the data rate that can be achieved by a CML device is limited. As the data rates of various communication technologies increase, there is an increasing need for a CML device that has a higher bandwidth, and that can thus support a higher data rate. Also, the output of the differential amplifier input stage of the CML device is typically provided at different voltage ranges, based upon the configuration of the CML device, and so one or more follower stages may be needed to couple the CML device to another type of device. Thus there is also a need for CML devices that provide a fixed output voltage.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

A current mode logic (CML) latch includes a transconductance input stage, a cross-coupled negative resistance stage, and a low impedance latch/output stage. The low impedance latch/output stage permits a higher effective bandwidth that is less sensitive to RC time constant constraints than is achieved with a typical CML latch, and provides a differential output that is compatible with CMOS logic gates without the addition of follower stages to level shift the differential output signals. The cross-coupled negative resistance stage provides a greater load driving capacity for the CML latch as compared with a typical CML latch.

Figure 1:
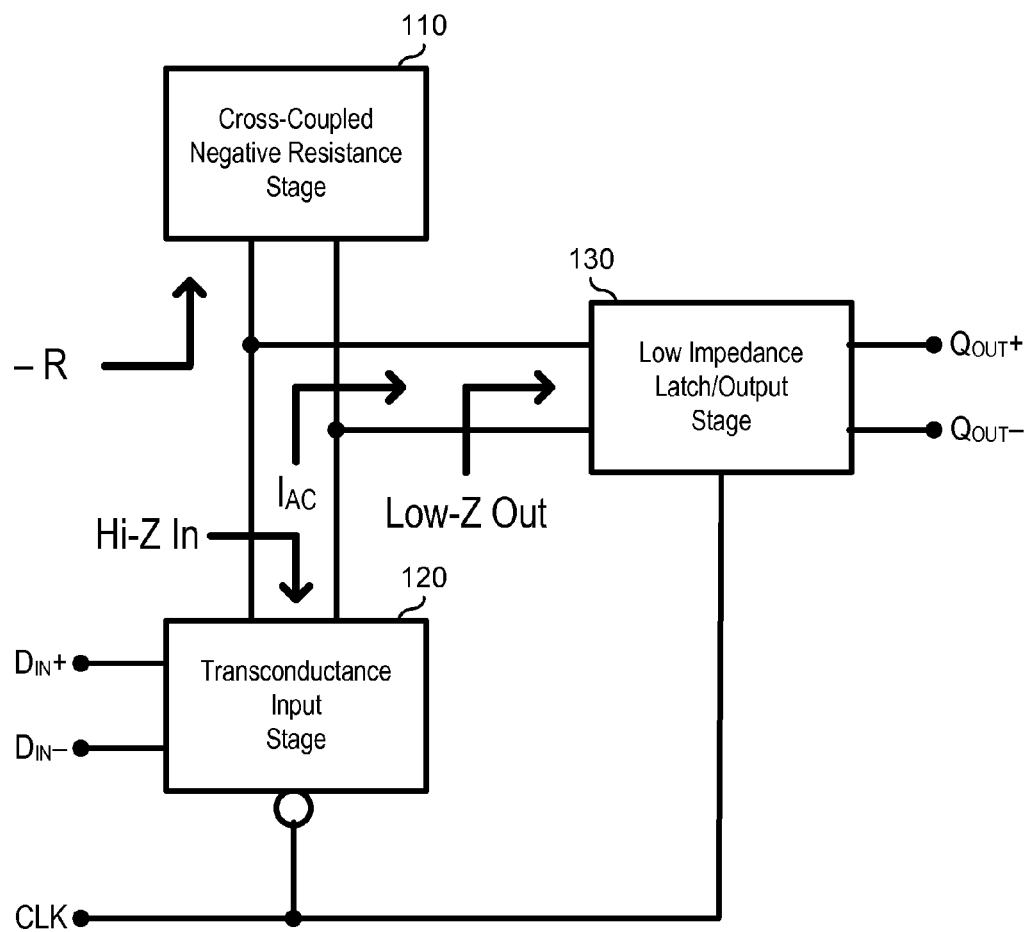
FIG. 1 is a block diagram of a CML latch according to an embodiment of the present disclosure.

FIG. 1 illustrates a CML latch 100 according to an embodiment of the present disclosure, including a cross-coupled negative resistance stage 110, a transconductance input stage 120, and a low impedance latch/output stage 130. CML latch 100 receives a clock input signal (CLK) and a differential data input including a $D_{IN}+$ signal and a $D_{IN}-$ signal, and provides a differential output including a $Q_{OUT}+$ signal and a $Q_{OUT}-$ signal. Transconductance input stage 120 receives an inverted version of the CLK signal and the differential input signals $D_{IN}+$ and $D_{IN}-$ and provides an intermediate differential output to cross-coupled negative resistance stage 110 and to low impedance latch/output stage 130. Low impedance latch/output stage 130 receives the intermediate differential output from transconductance input stage 120 and provides the differential output signals $Q_{OUT}+$ and $Q_{OUT}-$.

In operation, when the CLK signal is deasserted, transconductance input stage 120 is enabled, a latch portion of low impedance latch/output stage 130 is enabled, and a hold portion of the low impedance latch/output stage is disabled, and CML latch 100 is in a sample phase. Here, transconductance input stage 130 samples the differential input signals $D_{IN}+$ and $D_{IN}-$ and low impedance latch/output stage 130 latches the differential output signals $Q_{OUT}+$ and $Q_{OUT}-$ associated with the sampled input data. When the CLK signal is asserted, transconductance input stage 120 is disabled and low impedance latch/output stage 130 is enabled and CML latch 100 is in a hold phase. Here, low impedance latch/output stage 130 holds the differential output signals $Q_{OUT}+$ and $Q_{OUT}-$ associated with the previously sampled input data.

As compared with a typical CML latch, CML latch 100 operates with a higher effective bandwidth that is less sensitive to RC time constant constraints due to the low input impedance of low impedance latch/output stage 130, and provides a greater load driving capacity for follow-on logic devices due to the negative resistance properties of cross-coupled negative resistance stage 110. In addition, the differential output signals $Q_{OUT}+$ and $Q_{OUT}-$ from CML latch 100 are compatible with CMOS logic gates and so the CML latch can be utilized to drive CMOS loads without the need for additional follower stages to level shift the differential output signals.

Cross-coupled negative resistance stage 110 and low impedance latch/output stage 130 are operated in analog mode with constant DC current flow. In particular, cross-coupled negative resistance stage 110 operates to provide a negative resistance to boost the AC current gain from transconductance input stage 120. That is, the differential AC current is generated in the opposite direction from the differential AC voltage provided by transconductance input stage 120, such that when the differential AC voltage is high, the differential AC current is high, and vice versa. Thus, when the voltage swing of the intermediate differential signal becomes large, the current provided by cross-coupled negative resistance stage 110 is reduced and a greater portion of the AC current generated by transconductance input stage 120 is driven to low-impedance latch/output stage 130. Moreover, cross-coupled negative resistance stage 110 also provides a feed-forward effect to speed up the switching between the sample phase and the hold phase for CML latch 100.

Figure 2:
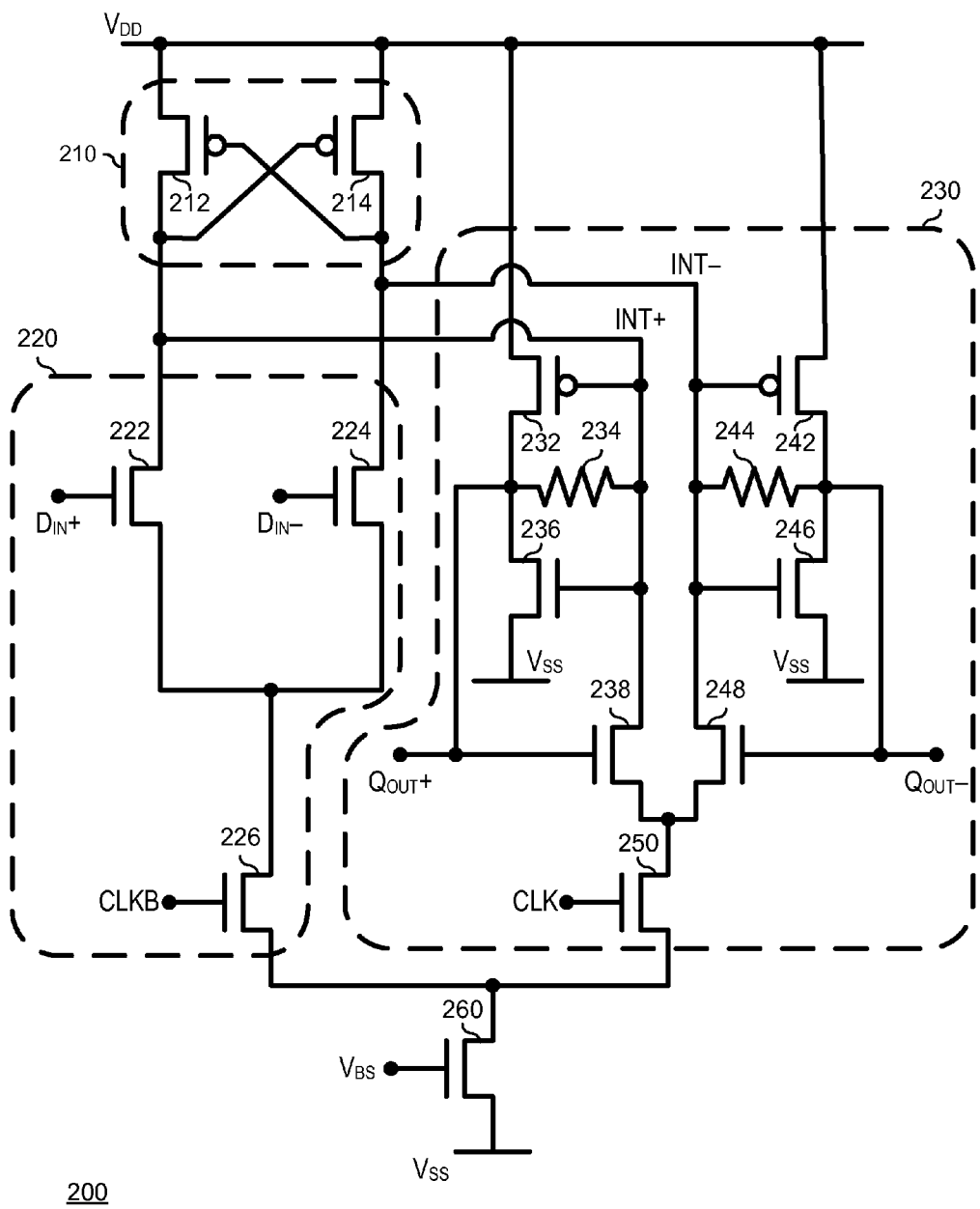
FIGS. 2-4 are schematic diagrams of a CML latch according to another embodiment of the present disclosure.

FIG. 2 illustrates a CML latch 200 similar to CML latch 100 and including a cross-coupled negative resistance stage 210, a transconductance input stage 220, a low-impedance latch/output stage 230, and a bias transistor 260. Cross-coupled negative resistance stage 110 includes transistors 212 and 214, transconductance input stage 220 includes transistors 222, 224, and 226, and low-impedance latch/output stage 230 includes transistors 232, 236, 238, 242, 246, 248 and 250, and resistors 234 and 244. Transistors 212, 214, 232, and 242 are p-type field effect transistors (FETs), such as PMOS transistors, and transistors 222, 224, 226, 236, 238, 246, 248, 250, and 260 are n-type FETs, such as NMOS transistors.

Transistor 212 includes a source electrode connected to a voltage supply $V_{DD}$, a gate electrode, and a drain electrode. Transistor 214 includes a source electrode connected to voltage supply $V_{DD}$, a gate electrode connected to the drain electrode of transistor 212, and a drain electrode connected to the gate electrode of transistor 212. Transistor 222 includes a drain electrode connected to the drain electrode of transistor 212, a gate electrode for receiving a positive input signal ($D_{IN}+$), and a source electrode. Transistor 224 includes a drain electrode connected to the drain electrode of transistor 214, a gate electrode for receiving a negative input signal ($D_{IN}-$), and a source electrode connected to the source electrode of transistor 222. Transistor 226 includes a drain electrode connected to the source electrodes of transistors 222 and 224, a gate electrode for receiving an inverted clock signal (CLKB), and a source electrode. Transistor 260 includes a drain electrode connected to the source electrode of transistor 226, a gate electrode for receiving a bias signal ($V_{BS}$), and a source electrode connected to a voltage supply $V_{SS}$. The node that connects the drain electrode of transistor 212, the drain electrode of transistor 222, and the gate electrode of transistor 214 forms a positive intermediate output signal (INT+) between transconductance input stage 220 and low-impedance latch/output stage 230, and the node that connects the drain electrode of transistor 214, the drain electrode of transistor 224, and the gate electrode of transistor 212 forms a negative intermediate output signal (INT−) output signal between the transconductance input stage and the low-impedance latch/output stage.

Low-impedance latch/output stage 230 includes a positive signal leg that includes transistors 232, 236, and 238, and resistor 234. Transistor 232 includes a source electrode connected to voltage supply $V_{DD}$, a gate electrode connected to the INT+ signal, and a drain electrode. Resistor 234 includes a first electrode connected to the INT+ signal and to the gate electrode of transistor 232, and a second electrode connected to the drain of transistor 232. Transistor 236 includes a drain electrode connected to the drain electrode of transistor 232 and to the second electrode of resistor 234, a gate electrode connected to the INT+ signal, to the gate electrode of transistor 232, and to the first electrode of resistor 234, and a source electrode connected to voltage supply $V_{SS}$. Transistor 238 includes a drain electrode connected to the INT+ signal, to the gate electrode of transistor 232, to the first electrode of resistor 234, and to the gate of transistor 236, a gate electrode connected to the drains of transistors 232 and 236 and to the second electrode of resistor 234, and a source electrode. The node that connects the drain electrodes of transistors 232 and 236, the second electrode of resistor 234, and the gate electrode of transistor 238 provides a positive output signal ($Q_{OUT}+$).

Low-impedance latch/output stage 230 also includes a negative signal leg that includes transistors 242, 246, and 248, and resistor 244. Transistor 242 includes a source electrode connected to voltage supply $V_{DD}$, a gate electrode connected to the INT− signal, and a drain electrode. Resistor 244 includes a first electrode connected to the INT− signal and to the gate electrode of transistor 242, and a second electrode connected to the drain of transistor 242. Transistor 246 includes a drain electrode connected to the drain electrode of transistor 242 and to the second electrode of resistor 244, a gate electrode connected to the INT− signal, to the gate electrode of transistor 242, and to the first electrode of resistor 244, and a source electrode connected to voltage supply $V_{SS}$. Transistor 248 includes a drain electrode connected to the INT− signal, to the gate electrode of transistor 242, to the first electrode of resistor 244, and to the gate of transistor 248, a gate electrode connected to the drains of transistors 242 and 246 and to the second electrode of resistor 244, and a source electrode connected to the source electrode of transistor 238. The node that connects the drain electrodes of transistors 242 and 246, the second electrode of resistor 244, and the gate electrode of transistor 248 provides a negative output signal ($Q_{OUT}-$). Transistor 250 includes a drain electrode connected to the source electrodes of transistors 238 and 248, a gate electrode for receiving a clock signal (CLK), and a source electrode connected to the source electrode of transistor 226 and to the drain electrode of transistor 260. Bias transistor 260 operates to receive the $V_{BS}$ input and to establish a bias current in CML latch 200.

Figure 3:
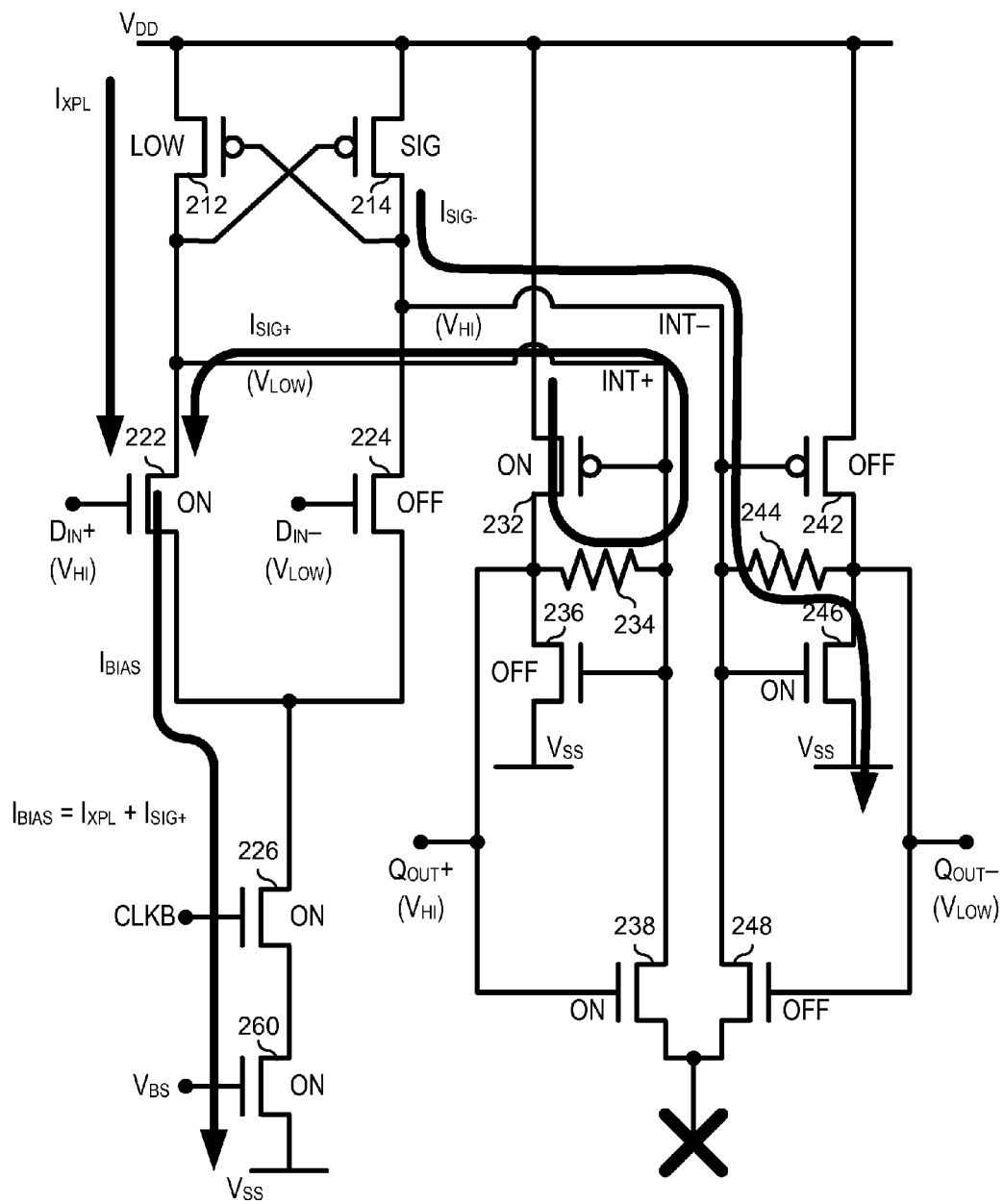

FIG. 3 illustrates a sample phase for CML latch 200. During the sample phase, the CLKB signal is asserted and transistor 226 is turned on, thereby activating transistors 212, 214, 222, and 224 (cross-coupled negative resistance stage 110 and transconductance input stage 120). Further, the CLK signal is deasserted and transistor 250 is turned off, thereby deactivating transistor 238 and 248. In the following example, a differential signal is assumed to be provided to the inputs of transconductance input stage 120, such that a positive side of the differential signal ($V_{HI}$) is provided to the gate electrode of transistor 222 ($D_{IN+}$) and that a negative side of the differential signal ($V_{LOW}$) is provided to the gate electrode of transistor 224 ($D_{IN-}$). The skilled artisan will recognize that the voltage levels described in CML devices in general, and in CML latch 200 in particular, are not to be confused with the voltage levels normally associated with CMOS circuits ($V_{DD}$ and $V_{SS}$). In particular, the differential voltage that is provided at the gate electrodes of transistors 222 and 224, and the other voltages described hereafter, are determined based upon the stack-up of the transistor between the voltage supply rails $V_{DD}$ and $V_{SS}$. As such, one or more transistors that are described herein as being in an "off" state will be understood to possibly be on in an absolute sense, but are allowing a comparatively smaller current than another transistor that is described herein as being in an "on" state.

In this example, transistor 222 is turned on and a bias current ($I_{BIAS}$) flows from $V_{DD}$ to $V_{SS}$ via transistors 222, 226, and 260. As a result, the positive side of the intermediate differential signal INT+ is pulled low. Further, transistor 224 is turned off and the negative side of the intermediate differential signal INT− is pulled high. With INT+ pulled low, transistor 214 is turned on to permit a negative component of a signal current to flow, as described below. Likewise, with INT− pulled high, transistor 212 is pinched off, and only a small current ($I_{XPL}$) flows through transistor 212, such that a large portion of the bias current ($I_{BIAS}$) is provided by a positive component of the signal current, as described below.

The positive signal leg of low-impedance latch/output stage 230 is driven by the low INT+ signal such that transistor 232 is turned on and transistor 236 is turned off. In this way, a positive current component ($I_{SIG+}$) flows from $V_{DD}$ to $V_{SS}$ via transistor 232, resistor 234, and transistors 222, 226, and 260, and the positive signal leg output ($Q_{OUT+}$) is held high. The negative signal leg of low-impedance latch/output stage 230 is driven by the high INT− signal such that transistor 242 is turned off and transistor 246 is turned on. In this way, a negative current component ($I_{SIG-}$) flows from $V_{DD}$ to $V_{SS}$ via transistor 214, resistor 244, and transistor 246, and the negative signal leg output ($Q_{OUT-}$) is held low. Note that the outputs of low-impedance latch/output stage 230 can operate together as positive and negative sides of a differential output signal ($Q_{OUT+}$ and $Q_{OUT-}$), or the outputs can operate individually as complimentary single sided CMOS outputs (Q and QB).

Figure 4:
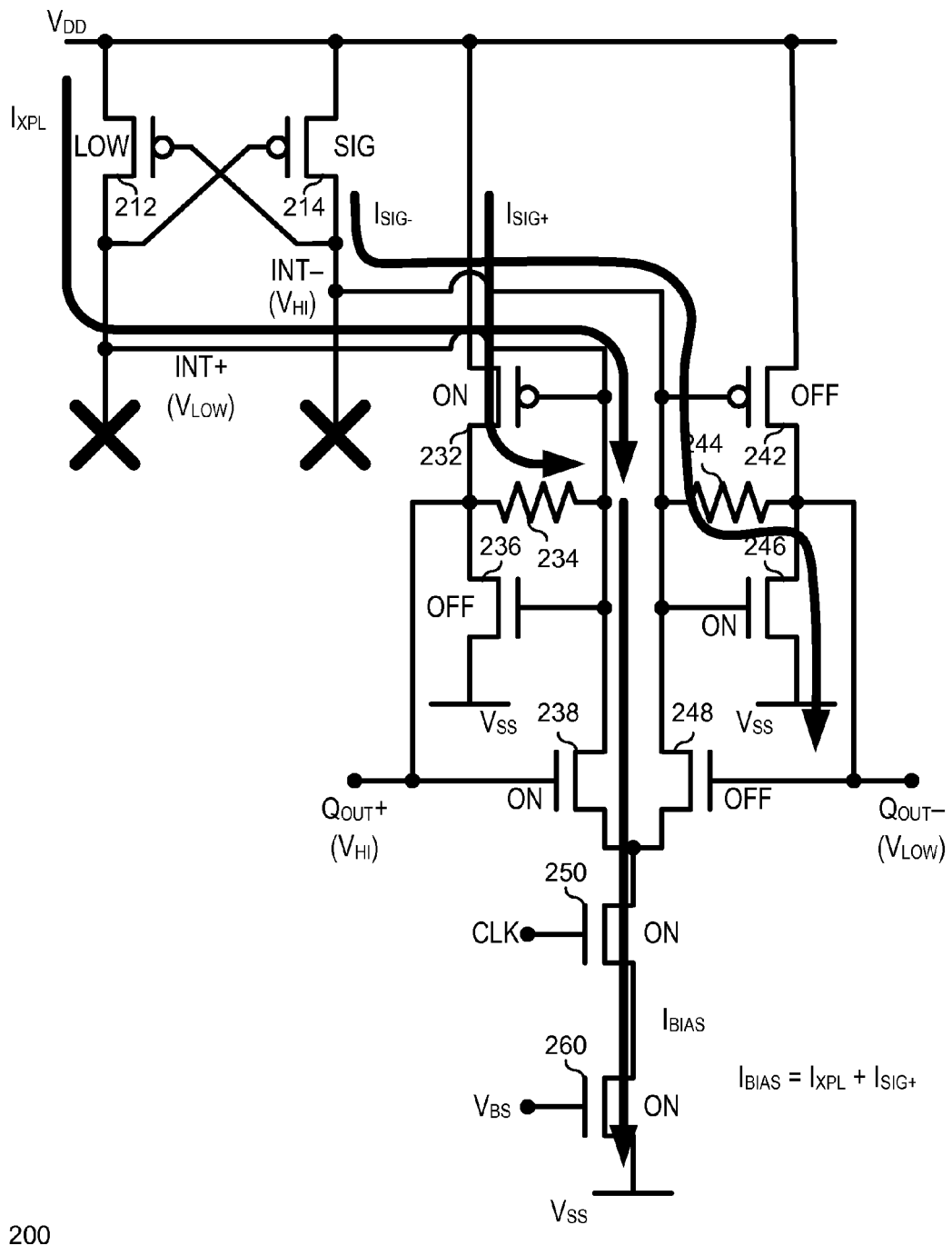

FIG. 4 illustrates a hold phase for CML latch 200. During the hold phase, the CLK signal is asserted and transistor 250 is turned on, thereby activating low-impedance latch/output stage 230. Further, the CLKB signal is deasserted and transistor 226 is turned off, thereby deactivating transconductance input stage 220. Using the above example, transistors 212, 232, 238, and 246, turned on, transistors 236, 242, and 248 are turned off, and transistor 214 is turned on to permit the signal current to flow. Here, the bias current ($I_{BIAS}$) flows from $V_{DD}$ to $V_{SS}$ via transistors 238, 250, and 260. Here, the positive current component ($I_{SIG+}$) flows from $V_{DD}$ to $V_{SS}$ via transistor 232, resistor 234, and transistors 238 and 250, and 260, and the positive signal leg output ($Q_{OUT+}$) remains high. Further, the negative current component ($I_{SIG-}$) flows from $V_{DD}$ to $V_{SS}$ via transistor 214, resistor 244, and transistor 246, and the negative signal leg output ($Q_{OUT-}$) remains low. Likewise, with INT− pulled high, transistor 212 is pinched off, and only a small current ($I_{XPL}$) flows through transistor 212, such that a large portion of the bias current ($I_{BIAS}$) is provided by a positive current component ($I_{SIG+}$).

Figure 5:
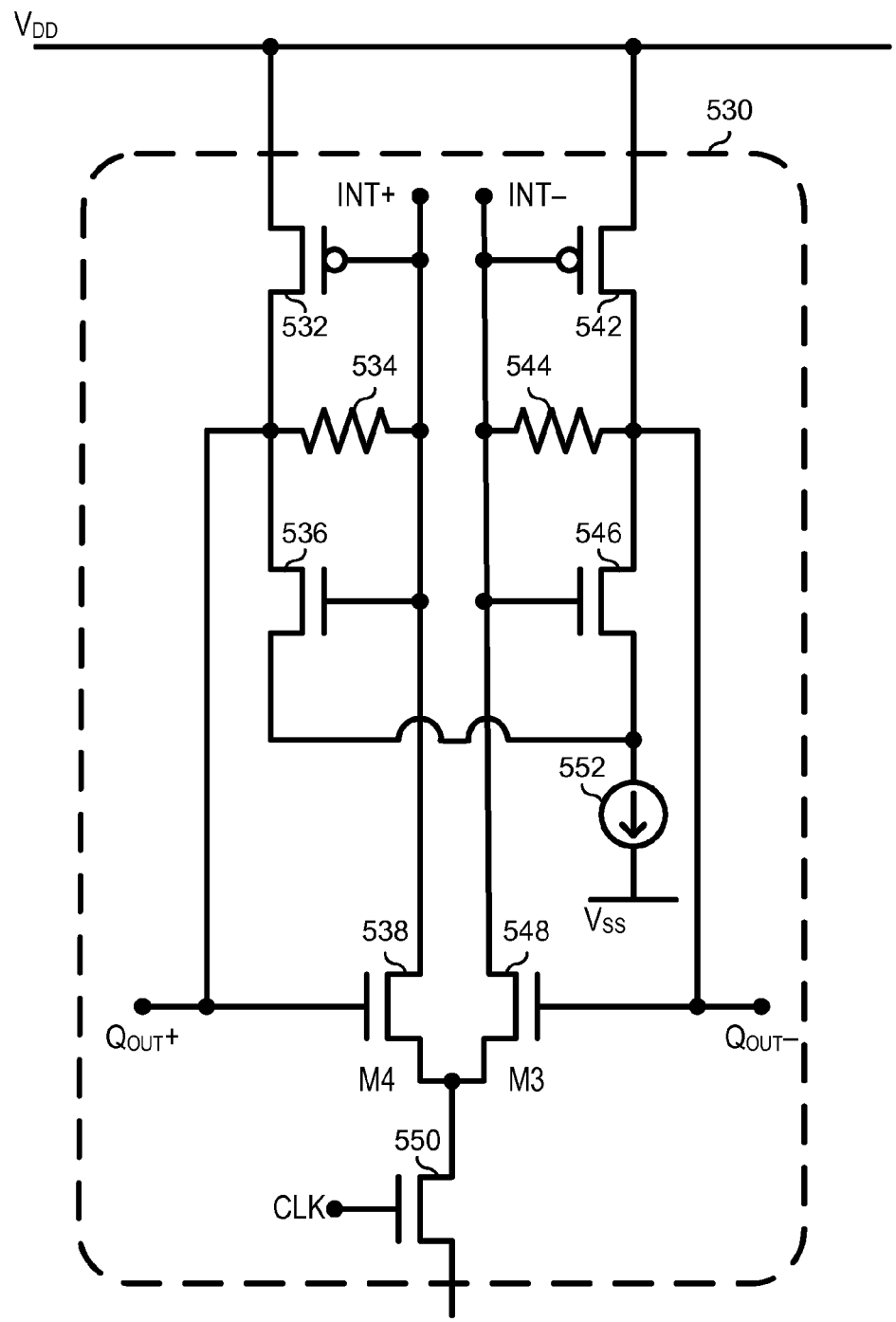
FIG. 5 is a schematic diagram of a low-impedance latch/output stage according to an embodiment of the present disclosure.

FIG. 5 illustrates a low-impedance latch/output stage 500 similar to low-impedance latch/output stage 230, including a positive signal leg having transistors 532, 536, and 538, and resistor 534. Transistor 532 includes a source electrode connected to voltage supply $V_{DD}$, a gate electrode connected to the INT+ signal, and a drain electrode. Resistor 534 includes a first electrode connected to the INT+ signal and to the gate electrode of transistor 532, and a second electrode connected to the drain of transistor 532. Transistor 536 includes a drain electrode connected to the drain electrode of transistor 532 and to the second electrode of resistor 534, a gate electrode connected to the INT+ signal, to the gate electrode of transistor 532, and to the first electrode of resistor 534, and a source electrode. Transistor 538 includes a drain electrode connected to the INT+ signal, to the gate electrode of transistor 532, to the first electrode of resistor 534, and to the gate of transistor 536, a gate electrode connected to the drains of transistors 532 and 536 and to the second electrode of resistor 534, and a source electrode. The node that connects the drain electrodes of transistors 532 and 536, the second electrode of resistor 534, and the gate electrode of transistor 538 provides a positive output signal ($Q_{OUT+}$).

Low-impedance latch/output stage 530 also includes a negative signal leg that includes transistors 542, 546, and 548, and resistor 544. Transistor 542 includes a source electrode connected to voltage supply $V_{DD}$, a gate electrode connected to the INT− signal, and a drain electrode. Resistor 544 includes a first electrode connected to the INT− signal and to the gate electrode of transistor 542, and a second electrode connected to the drain of transistor 542. Transistor 546 includes a drain electrode connected to the drain electrode of transistor 542 and to the second electrode of resistor 544, a gate electrode connected to the INT− signal, to the gate electrode of transistor 542, and to the first electrode of resistor 544, and a source electrode connected to the source electrode of transistor 536. Transistor 548 includes a drain electrode connected to the INT− signal, to the gate electrode of transistor 542, to the first electrode of resistor 544, and to the gate of transistor 546, a gate electrode connected to the drains of transistors 542 and 546 and to the second electrode of resistor 544, and a source electrode connected to the source electrode of transistor 538. The node that connects the drain electrodes of transistors 542 and 546, the second electrode of resistor 544, and the gate electrode of transistor 548 provides a negative output signal ($Q_{OUT-}$). Transistor 550 includes a drain electrode connected to the source electrodes of transistors 538 and 548, a gate electrode for receiving a clock signal (CLK), and a source electrode connected to a drain electrode of a bias transistor similar to bias transistor 260. Low-impedance latch/output stage 530 also includes a current source 552 including a first electrode connected to the source electrodes of transistors 536 and 546, and a second electrode connected to a voltage supply $V_{SS}$. Current source 552 operates to maintain DC biasing conditions in low-impedance latch/output stage 530, and thus operates to improve the noise rejection capacity against coupling from the power supplies. The total current through transistor 536 and 546 remains constant at the current level provided by current source 552. In all other respects, low-impedance latch/output stage 500 operates similarly to low-impedance latch/output stage 230, as described above.

Thus the CML latches as disclosed herein operate with a higher effective bandwidth that is less sensitive to RC time constant constraints and with a greater load driving capacity than a typical CML latch. Moreover, the CML latches as disclosed herein provide outputs that are compatible with CMOS logic gates.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A current mode logic (CML) latch comprising:
   an input stage including a positive input node to receive a positive side of a differential input signal, a negative input node to receive a negative side of the differential input signal, a positive output node to provide a positive side of a differential intermediate output signal, and a negative output node to provide a negative side of the differential intermediate output signal;
   a negative resistance stage including an input node connected to a first voltage source, a positive output node connected to the positive output node of the input stage and a negative output node connected to the negative output node of the input stage, the negative resistance stage to increase a current gain of the input stage; and
   a latch stage including a positive input node connected to the positive output node of the input stage, a negative input node connected to the negative output node of the input stage, a positive output node to provide a positive side of a differential output signal, and a negative output node to provide a negative side of the differential output signal.

2. The CML latch of claim 1, wherein the negative resistance stage comprises:
   a first transistor of a first conductivity type, including a first current electrode connected to the first voltage source, a control electrode connected to the negative output node of the input stage, and a second electrode connected to the positive output node of the input stage; and
   a second transistor of the first conductivity type, including a first current electrode connected to the first voltage source, a control electrode connected to the positive output node of the input stage, and a second current electrode connected to the negative output node of the input stage.

3. The CML latch of claim 2, wherein the first and second transistors are p-type field effect transistors.

4. The CIVIL latch of claim 1, wherein the latch stage comprises:
   a first transistor of a first conductivity type, including a first current electrode connected to the first voltage source, a control electrode connected to the positive output node of the input stage, and a second current electrode;
   a first resistive element including a first electrode connected to the positive output node of the input stage and a second electrode connected to the second current electrode of the first transistor;
   a second transistor of a second conductivity type, including a first current electrode connected to the second current electrode of the first transistor and to the second electrode of the first resistive element, a control electrode connected to the positive output node of the input stage, and a second current electrode coupled to a second voltage source;
   a third transistor of the first conductivity type, including a first current electrode connected to the first voltage source, a control electrode connected to the negative output node of the input stage, and a second current electrode;
   a second resistive element including a first electrode connected to the negative output node of the input stage and a second electrode connected to the second current electrode of the third transistor; and
   a fourth transistor of the second conductivity type, including a first current electrode connected to the second current electrode of the third transistor and to the second electrode of the second resistive element, a control electrode connected to the negative output node of the input stage, and a second current electrode coupled to the second voltage source.

5. The CML latch of claim 4, wherein the latch stage further comprises:
   a current source including a first electrode connected to the second current electrode of the second transistor and to the second current electrode of the fourth transistor, and a second electrode connected to the second voltage source.

6. The CML latch of claim 4, wherein the latch stage further comprises:
   a fifth transistor of the second conductivity type, including a first current electrode connected to the positive output node of the input stage, a control electrode connected to the second current electrode of the first transistor, the first current electrode of the second transistor, and the second electrode of the first resistive element, and a second current electrode coupled to the second voltage source; and
   a sixth transistor of the second conductivity type, including a first current electrode connected to the negative output node of the input stage, a control electrode connected to the second current electrode of the third transistor, the first current electrode of the fourth transistor, and the second electrode of the second resistive element, and a second current electrode coupled to the second voltage source.

7. The CML latch of claim 6, wherein the latch stage further comprises:
   a seventh transistor of the second conductivity type, including a first current electrode connected to the second current electrode of the fifth transistor and the second current electrode of the sixth transistor, a control electrode to receive a clock input, and a second current electrode coupled to the second voltage source.

8. The CML latch of claim 7, wherein the first and third transistors are p-type field effect transistors and the second, fourth, fifth, sixth, and seventh transistors are n-type field effect transistors.

9. The CML latch of claim 1, wherein the input stage comprises a transconductance amplifier differential input device.

10. The CML latch of claim 9, wherein the transconductance amplifier differential input device comprises:
    a first transistor of a second conductivity type, including a first current electrode connected to the positive output node of the input stage, a control electrode connected to the positive input node of the input stage, and a second current electrode coupled to a second voltage source; and
    a second transistor of the second conductivity type, including a first current electrode connected to the negative output node of the input stage, a control electrode connected to the negative input node of the input stage, and a second current electrode coupled to the second voltage source, wherein the first and second transistors of the transconductance stage provide a linear operation function.

11. The CML latch of claim 10, wherein the input stage further comprises:
    a third transistor of the second conductivity type, including a first current electrode connected to the second current electrode of the first transistor and the second current electrode of the second transistor, a control electrode to receive a clock input, and a second current electrode coupled to the second voltage source, wherein the third transistor operates to enable the input stage during a sample phase.

12. The CML latch of claim 11, wherein the first, second, and third transistors are n-type field effect transistors.

13. A method comprising:
receiving, at an input stage of a current mode logic (CML) latch, a differential input signal;
providing, from the input stage, a differential intermediate output signal in response to receiving the differential input signal;
increasing, by a negative resistance stage of the CML latch coupled to the input stage, a current gain of the differential intermediate output signal;
latching, by a latch stage of the CML latch, the differential intermediate output signal; and
providing, from the latch stage, a differential output signal based upon the latched differential intermediate output signal.

14. The method of claim 13, further comprising:
providing, during a sample phase, a first bias current through the input stage;
wherein, in increasing the current gain of the differential intermediate output signal, the method further comprises:
providing a negative side of the differential intermediate output signal to a control electrode of a first transistor, wherein a first current electrode of the first transistor is connected to a first voltage supply, and a second current electrode of the first transistor is connected to the input stage to provide a positive side of the differential intermediate output signal, such that, when the negative side of the differential intermediate output signal is at a high voltage portion of the differential intermediate output signal, the first transistor is turned off and the first bias current is provided to the input stage from a positive latch leg of the latch stage; and
providing the positive side of the differential intermediate output signal to a control electrode of a second transistor, wherein a first current electrode of the second transistor is connected to the first voltage supply, and a second current electrode of the second transistor is connected to the input stage to provide the negative side of the differential intermediate output signal, such that, when the positive side of the differential intermediate output signal is at a high voltage portion of the differential intermediate output signal, the second transistor is turned off and the first bias current is provided to the input stage from a negative latch leg of the latch stage.

15. The method of claim 14, further comprising:
receiving, at the positive latch leg of the latch stage, the positive side of the differential intermediate output signal;
providing, at the positive latch leg, a positive side of the latch stage output;
receiving, at the negative latch leg of the latch stage, the negative side of the differential intermediate output signal; and
providing, at the negative latch leg, a negative side of the latch stage output.

16. The method of claim 15, wherein the latch stage further comprises:
providing, by a current source of the latch stage, a second bias current in the positive latch leg and the negative latch leg.

17. The method of claim 15, wherein the latch stage further comprises:
receiving, at a transistor of the latch stage, a clock input, wherein the transistor operates to enable the latch stage during a hold phase.

18. The method of claim 13, wherein the input stage comprises a transconductance amplifier differential input device.

19. The method of claim 13, further comprising:
receiving, at a control electrode of a first transistor of the transconductance amplifier differential input device, a positive side of the differential input signal;
providing, from a current electrode of the first transistor, a positive side of the differential intermediate output signal;
receiving, at a control electrode of a second transistor of the transconductance amplifier differential input device, a negative side of the differential input signal; and
providing, from a current electrode of the second transistor, a negative side of the differential intermediate output signal.

20. A current mode logic (CML) latch comprising:
an input stage including a positive input node to receive a positive side of a differential input signal, a negative input node to receive a negative side of the differential input signal, a positive output node to provide a positive side of a differential intermediate output signal, and a negative output node to provide a negative side of the differential intermediate output signal;
a negative resistance stage including:
a first transistor of a first conductivity type, including a first current electrode connected to a first voltage source, a control electrode connected to the negative output node of the input stage, and a second electrode connected to the positive output node of the input stage; and
a second transistor of the first conductivity type, including a first current electrode connected to the first voltage source, a control electrode connected to the positive output node of the input stage, and a second current electrode connected to the negative output node of the input stage; and
a latch stage including:
a third transistor of a first conductivity type, including a first current electrode connected to the first voltage source, a control electrode connected to the positive output node of the input stage, and a second current electrode;
a first resistive element including a first electrode connected to the positive output node of the input stage and a second electrode connected to the second current electrode of the third transistor;
a fourth transistor of a second conductivity type, including a first current electrode connected to the second current electrode of the third transistor and to the second electrode of the first resistive element, a control electrode connected to the positive output node of the input stage, and a second current electrode coupled to a second voltage source, wherein the positive output node of the latch stage comprises the second current electrode of the third transistor, the first current electrode of the fourth transistor and the second electrode of the first resistive element;
a fifth transistor of the first conductivity type, including a first current electrode connected to the first voltage source, a control electrode connected to the negative output node of the input stage, and a second current electrode;

a second resistive element including a first electrode connected to the negative output node of the input stage and a second electrode connected to the second current electrode of the fifth transistor; and a sixth transistor of the second conductivity type, including a first current electrode connected to the second current electrode of the fifth transistor and to the second electrode of the second resistive element, a control electrode connected to the negative output node of the input stage, and a second current electrode coupled to the second voltage source, wherein the negative output node of the latch stage comprises the second current electrode of the fifth transistor, the first current electrode of the sixth transistor and the second electrode of the second resistive element.

* * * * *